United States Patent [19]

Kamiyama

[11] Patent Number: 5,438,012

[45] Date of Patent: * Aug. 1, 1995

[54] METHOD OF FABRICATING CAPACITOR ELEMENT IN SUPER-LSI

[75] Inventor: Satoshi Kamiyama, Tokyo, Japan

[73] Assignee: NEC Corporation, Japan

[ * ] Notice: The portion of the term of this patent subsequent to Apr. 13, 2010 has been disclaimed.

[21] Appl. No.: 102,634

[22] Filed: Aug. 5, 1993

[30] Foreign Application Priority Data

Aug. 6, 1992 [JP] Japan .................................. 4-209879

[51] Int. Cl.⁶ ........................................... H01L 21/70
[52] U.S. Cl. ...................................... 437/60; 437/52; 437/240; 437/919
[58] Field of Search ....................... 437/47, 48, 52, 60, 437/240, 919; 257/310

[56] References Cited

U.S. PATENT DOCUMENTS 4,990,463  2/1991  Mori ..................... 437/919
5,202,280  4/1993  Kamiyama et al. .................. 437/919
5,248,629  9/1993  Muroyama .......................... 437/919

Primary Examiner—Tom Thomas
Attorney, Agent, or Firm—Laff, Whitesel, Conte & Saret, Ltd.

[57] ABSTRACT

A capacitor element of a semiconductor device used for a super-LSI is formed by the steps including (a) removing a natural oxide film on a surface of a lower electrode of polysilicon, (b) forming on the surface of the lower electrode an impurity-doped tantalum oxide film, and (c) forming an upper electrode with at least a bottom thereof constituted by titanium nitride. The steps may further include (d) nitriding the surface of the lower electrode after the removal of the natural oxide film, and (e) densifying the tantalum oxide film by way of a high temperature heat treatment after the formation of the tantalum oxide film. In this way, it is possible to reduce thickness of a capacitive insulating film and to form the capacitor element in which the leakage current characteristics are improved.

9 Claims, 6 Drawing Sheets

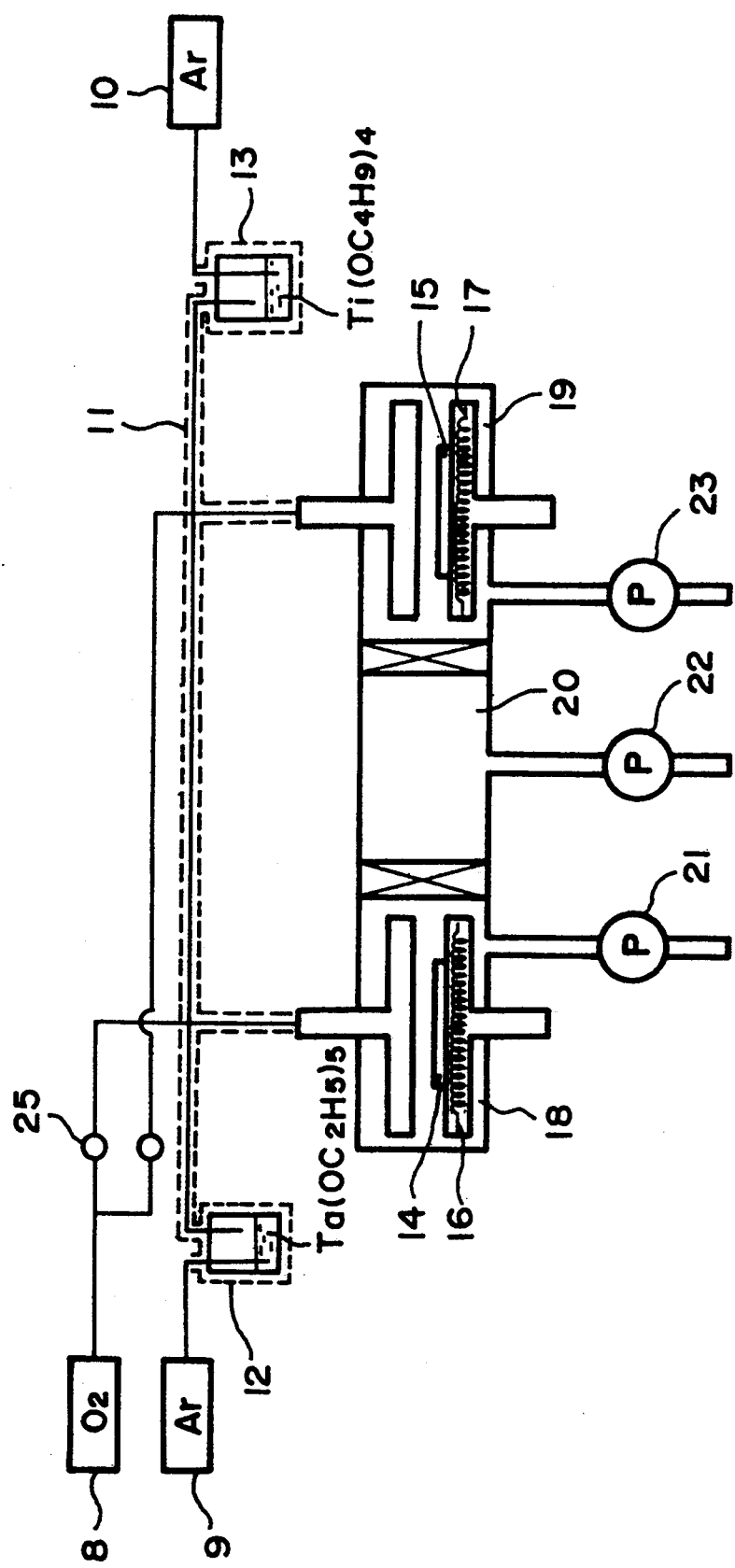

METHOD OF FABRICATING CAPACITOR ELEMENT IN SUPER-LSI

BACKGROUND OF THE INVENTION

(1) Field of the Invention

The present invention relates to a method of fabricating semiconductor devices, and more particularly to a method of forming a capacitor element in super-LSIs such as DRAMs (Dynamic Random Access Memories).

(2) Description of the Related Art

With respect to the capacitor of super-LSI memory devices over 256 MB (megabytes) DRAM, researches and investigations have been made for the adoption of high dielectric capacitive insulating films which permit increasing the capacitance per unit area. Among the high dielectric capacitive insulating films that are being studied, the tantalum oxide film formed by a chemical vapor deposition (CVD) process has high specific dielectric constant $\epsilon_r$ of 25 to 30 and an excellent step coverage characteristic. Further, its film formation process is extremely easy compared to that in other high dielectric capacitive insulating films. For these reasons, extensive researches are being carried out in this field of technology.

FIGS. 1A, 1B and 1C show, in sectional views, successive steps of The conventional process of forming a capacitor element using a tantalum film.

First, as seen in FIG. 1A, polysilicon is deposited by the CVD process on a p-type silicon substrate 1, which has an n-type diffusion layer 1a at its surface region, and on which an element isolation region 2 having an opening reaching the n-type diffusion layer 1a is formed. Then, phosphorus (P) is thermally diffused, and then a polysilicon inner or lower electrode 3 is formed by a usual lithographic technique. In this stage, a natural oxide film 4 is formed on the surface of the polysilicon electrode 3.

Subsequently, as seen in FIG. 1B, a tantalum oxide film 7 is formed on the polysilicon lower electrode 3 by a low-pressure chemical vapor deposition (LPCVD) process using ethoxytantalum (Ta(OC$_2$H$_5$)$_5$) as a source gas. The wafer is then subjected to a high temperature heat treatment in oxygen atmosphere at 600° to 1000° C. to reduce leakage current, thereby improving the leakage current characteristics in the tantalum oxide film 7. At this time, the natural oxide film 4 becomes a SiO$_2$ film 4a. Subsequently, as shown in FIG. 1C, an outer or upper electrode 6 is formed. For the upper electrode 6, tungsten (W) is generally used. Through the above steps, the formation of the capacitor is completed.

The above prior art capacitor structure has the following problems. In the prior art capacitor formation process, the capacitor that is formed by forming the tantalum oxide film 7 on the polysilicon as the lower electrode 3, followed by the high temperature heat treatment in oxygen atmosphere to improve the leakage current characteristics, has a capacitance of only up to about 3 nm in thickness (Cs=12 pF/$\mu$m$^2$) in terms of the equivalent thickness converted into SiO$_2$ film (specific dielectric constant $\epsilon_r$=3.9). This is so because, due to the high temperature heat treatment performed in oxygen atmosphere to improve the leakage current characteristics of the tantalum oxide film, the natural oxide film 4 present at the interface between the tantalum oxide film 7 and the polysilicon electrode 3 is increased in thickness and becomes the SiO$_2$ film 4a. Where this capacitive insulating film is used in a capacitor over 256 MB DRAM, a sufficient capacitance cannot be obtained. Another problem is that the capacitor element formed in the prior art has a leakage current characteristic (10$^{-8}$ A/cm$^2$) with a low voltage of about 0.7 V as can be seen in FIG. 6. The capacitor element having such leakage current characteristics cannot be applied to any practical device.

SUMMARY OF THE INVENTION

It is, therefore, an object of the present invention to overcome the problems existing in the prior art method and to provide a method of fabricating a capacitor element of a semiconductor device adapted to be used for a super-LSI such as a DRAM in which a capacitive insulating film is made thin thereby enabling to improve leakage current characteristics.

According to one aspect of the invention, there is provided a method of fabricating a semiconductor device, in which a capacitor element used for a super-LSI such as a DRAM is formed by a process comprising the steps of:

removing a natural oxide film on a surface of a lower electrode of polysilicon;

forming on the surface of the lower electrode a tantalum oxide film doped with impurities; and forming on the tantalum oxide film an upper electrode with at least a bottom of the upper electrode constituted by titanium nitride.

In the method of forming the capacitor element according to the invention, a natural oxide film is removed on the surface of a polysilicon electrode as a lower electrode of the capacitor element, then an impurity-doped tantalum oxide film is formed as a capacitive insulating film, and then an upper electrode of titanium nitride is formed. It is possible to reduce the thickness of the capacitive insulating film and to form the capacitor element in which the leakage current characteristics are improved.

BRIEF DESCRIPTION OF THE DRAWINGS

The above and other objects, features and advantages of the present invention will be apparent from the following description of preferred embodiments of the invention explained with reference to the accompanying drawings, in which:

FIG. 3 is a diagram illustrating an apparatus used in the formation of impurity-doped tantalum oxide films;

PREFERRED EMBODIMENTS OF THE INVENTION

Now, the invention will be described with reference to the accompanying drawings. It should be noted that, throughout the following explanation, similar reference symbols or numerals refer to the same or similar elements in all the figures of the drawings.

FIGS. 2A to 2D show the sequential steps of fabricating a capacitor element according to the first embodiment of the invention.

Figure 1A:
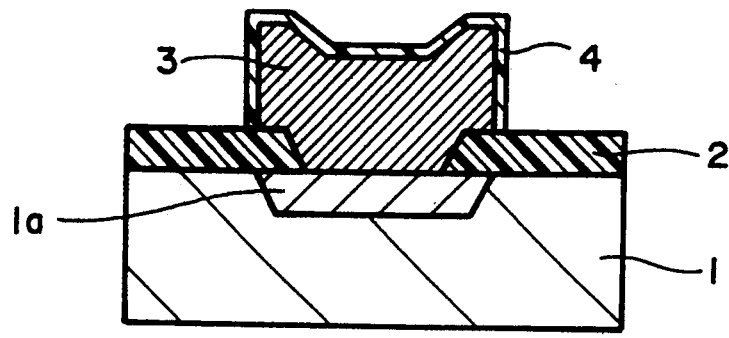
FIGS. 1A–1C are sectional views illustrating sequential steps followed in a conventional method of fabricating a capacitor element of a semiconductor device.
Figure 1B:
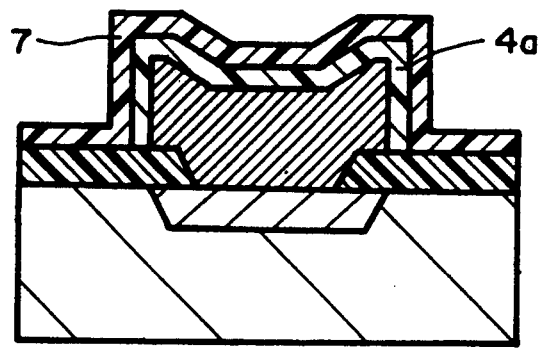
Figure 1C:
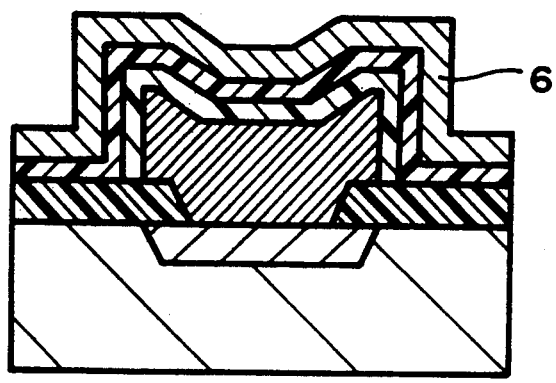
Figure 2A:
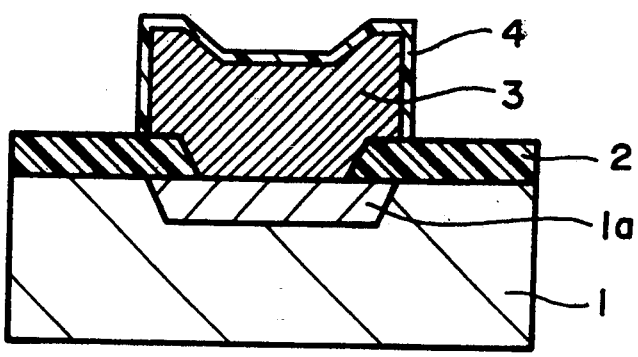
FIGS. 2A–2D are sectional views illustrating sequential steps followed in a method of fabricating a capacitor element, according to a first embodiment of the present invention.

FIG. 2A is first referred to. On a p-type silicon substrate 1 having on its surface region an n-type diffusion layer 1a, an element isolation region 2 is formed by a LOCOS (Local Oxidation of Silicon) process. Then, a polysilicon film is deposited by the CVD process on the substrate, then doped with phosphorus (P) by thermal diffusion, and then patterned by a usual lithography and etching technique to form a polysilicon electrode 3. At this time, a natural oxide film 4 is formed on a surface of the polysilicon electrode 3.

Figure 2B:
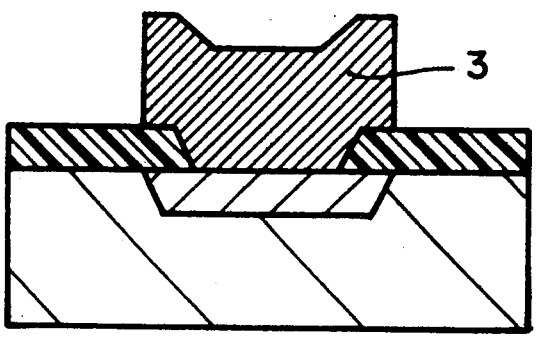

Then, as shown in FIG. 2B, the natural oxide film 4 on the polysilicon electrode 3 is removed using anhydrous hydrofluoric acid.

Figure 2C:
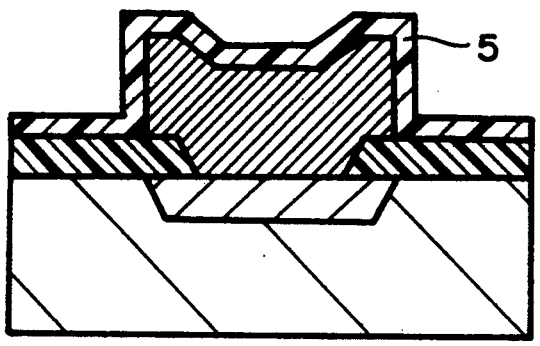

Then, as shown in FIG. 2C, an impurity-doped tantalum oxide film 5 is deposited by the CVD process.

Figure 2D:
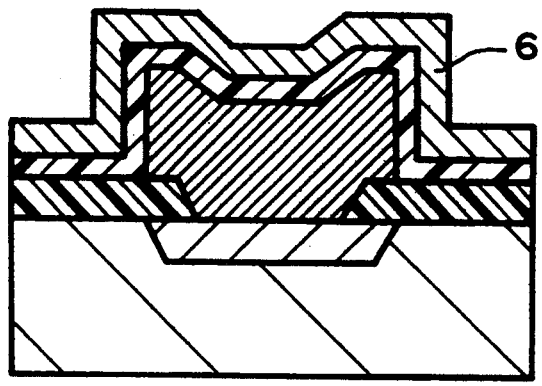

Then, as shown in FIG. 2D, titanium nitride is formed as an upper electrode 6.

The impurity-doped tantalum oxide film 5 shown in FIG. 2C is formed by using an apparatus as shown in FIG. 3. Source gases for the tantalum oxide film formation are organic tantalum gas (tantalum penta-ethoxide ($Ta(OC_2H_5)_5$)) and organic titanium gas (titanium tetrabutoxide ($Ti(OC_4H_9)_4$)). These source materials are gasified in respective gasification chambers 12 and 13 to be led together with argon gas 9 as a carrier gas, to a reaction chamber 18. At the same time, oxygen gas is led through a valve 25 to the reaction chamber 18. The reaction chamber 18 is heated by a heater 16 to cause chemical vapor phase reaction of the introduced organic tantalum, organic titanium and oxygen gases. A tantalum oxide film doped with tantalum impurity is thus formed on the wafer 14. As suitable conditions for the film growth, the heating temperature in the gasification chamber 12 of the organic tantalum material is 30° to 200° C., the heating temperature in the gasification chamber 13 of the organic titanium material is also 30° to 200° C., the growth temperature in the reaction chamber 18 heated by the heater 16 is 300 to 800° C., the rate of flow of argon gas as the carrier gas is 10 to 1000 SCCM, and the flow rate and pressure of oxygen gas are 0.1 to 20.0 OSLM and 0.1 to 10 Torr, respectively. While this embodiment used the reaction chamber 18 for forming the titanium-doped tantalum oxide film 5, a similar film may be formed in the case where a reaction chamber 19 is used. Further, while in this embodiment, titanium was doped as impurity, it is possible to dope at least one element selected from the group consisting of silicon (Si), boron (B), phosphorus (P) and germanium (Ge).

Further, while the above embodiment uses a titanium oxide monolayer as the upper electrode, the same effects are obtainable with tungsten or such a composite film as titanium oxide/tungsten, titanium nitride/molybdenum, titanium nitride/tungsten silicide.

FIGS. 4A to 4D show, in sectional views, sequential steps for explaining a second embodiment of the present invention.

Figure 4A:
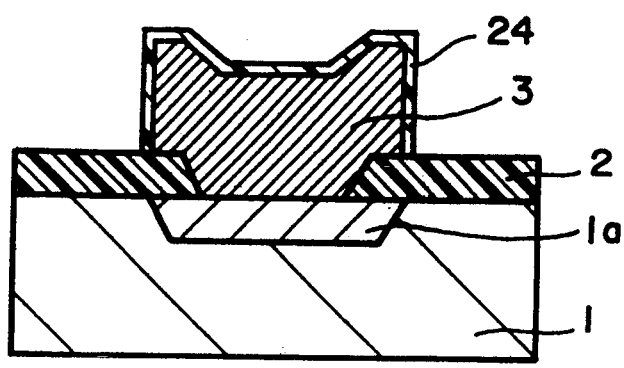
FIGS. 4A–4D are sectional views illustrating sequential steps used in a method of fabricating a capacitor element, according to a second embodiment of the present invention.

Like the preceding first embodiment, after removal of the natural oxide film 4 with hydrofluoric acid, as shown in FIG. 4A, a silicon nitride film 24 is formed on the polysilicon electrode 3 by a quick temperature raise heat treatment using ammonia gas ($NH_3$). The temperature of this nitriding treatment is suitably 800° to 1000° C.

Figure 4B:
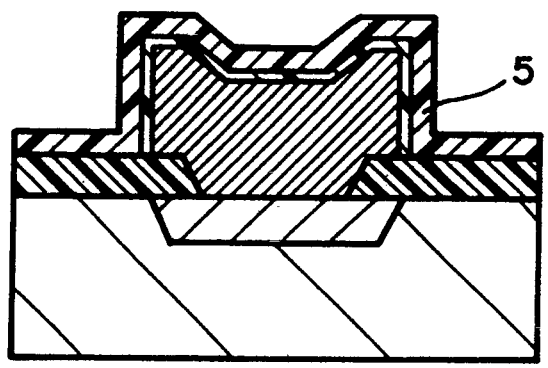

Then, as shown in FIG. 4B, an impurity-doped tantalum oxide film 5 is deposited by the CVD process. This impurity-doped tantalum oxide film 5 is suitably formed under the same conditions as in the previous first embodiment.

Figure 4C:
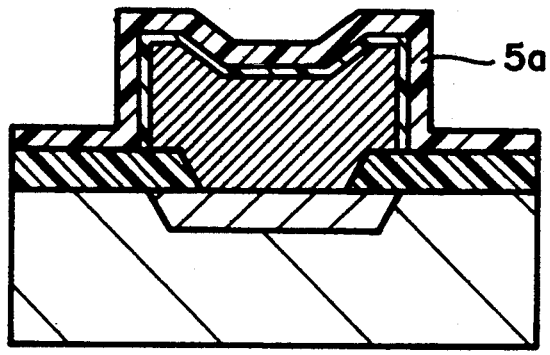

Further, as seen in FIG. 4C, the deposited titanium-doped tantalum oxide film 5 is converted into a densified tantalum oxide film 5a through a densifying treatment by a high temperature heat treatment. The densifying treatment is suitably carried out by using a high rate heating system using an electric furnace or lamp heating and in nitrogen, argon or like inert gas atmosphere at a temperature of 600° to 1000°.

Figure 4D:
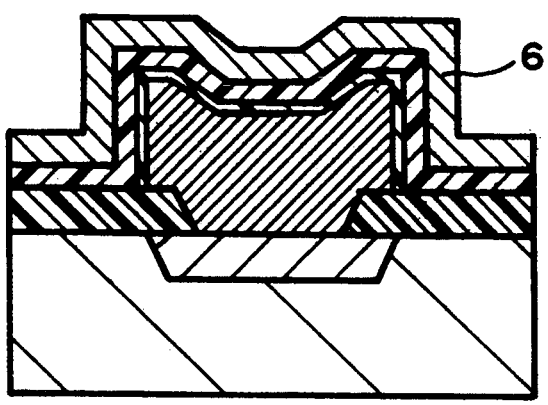

Subsequently, as shown in FIG. 4D, a titanium nitride film 6 is formed as an upper electrode 6. While this embodiment again used a titanium nitride monolayer as the upper electrode 6, the same effects are obtainable as well by using tungsten or such a composite film as titanium nitride/tungsten, titanium nitride/molybdenum, titanium nitride/tungsten.

Figure 5:
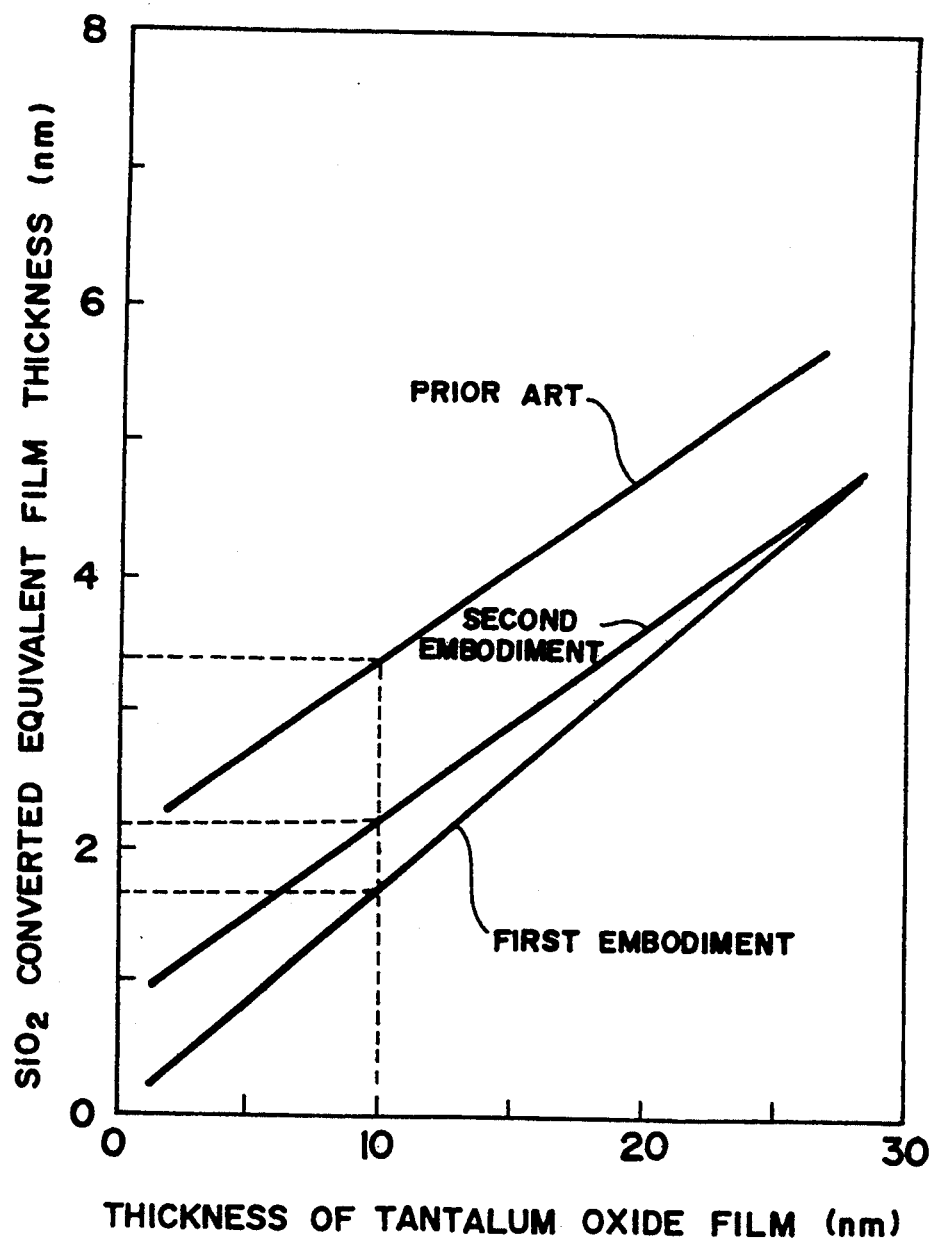
FIG. 5 is a graph showing changes in SiO$_2$ converted equivalent film thicknesses with respect to tantalum oxide film thicknesses in the structures fabricated according to the methods of the prior art, the first embodiment and the second embodiment of the invention.

FIG. 5 shows changes in $SiO_2$ converted equivalent film thicknesses with respect to tantalum oxide film thicknesses in devices fabricated on the basis of the above first and second embodiments of the invention. The graph shows results of measurement of the $SiO_2$ converted equivalent film thickness plotted against the thickness of tantalum oxide film in devices fabricated on the basis of the first and second embodiments and the prior art. As can be seen from the graph, the $SiO_2$ converted equivalent film thickness is smaller in the first and second embodiments compared to that in the device formed on the basis of the prior art. Further, it is smaller in the first embodiment than in the second embodiment. These results are obtained because, in the case of the prior art, a $SiO_2$ film of about 2 nm is formed at the interface between the tantalum oxide film and the polysilicon electrode, whereas the film thickness of the $SiO_2$ film is about 1 nm in the case of the second embodiment and is almost negligible in the case of the first embodiment. As an example, when a tantalum oxide film with a thickness of 10 nm is used, the equivalent thickness of the $SiO_2$ converted film is about 3.5 nm in the case of the prior art, whereas it is as small as about 1.5 nm in the case of the first embodiment and about 2 nm in the case of the second embodiment.

Figure 6:
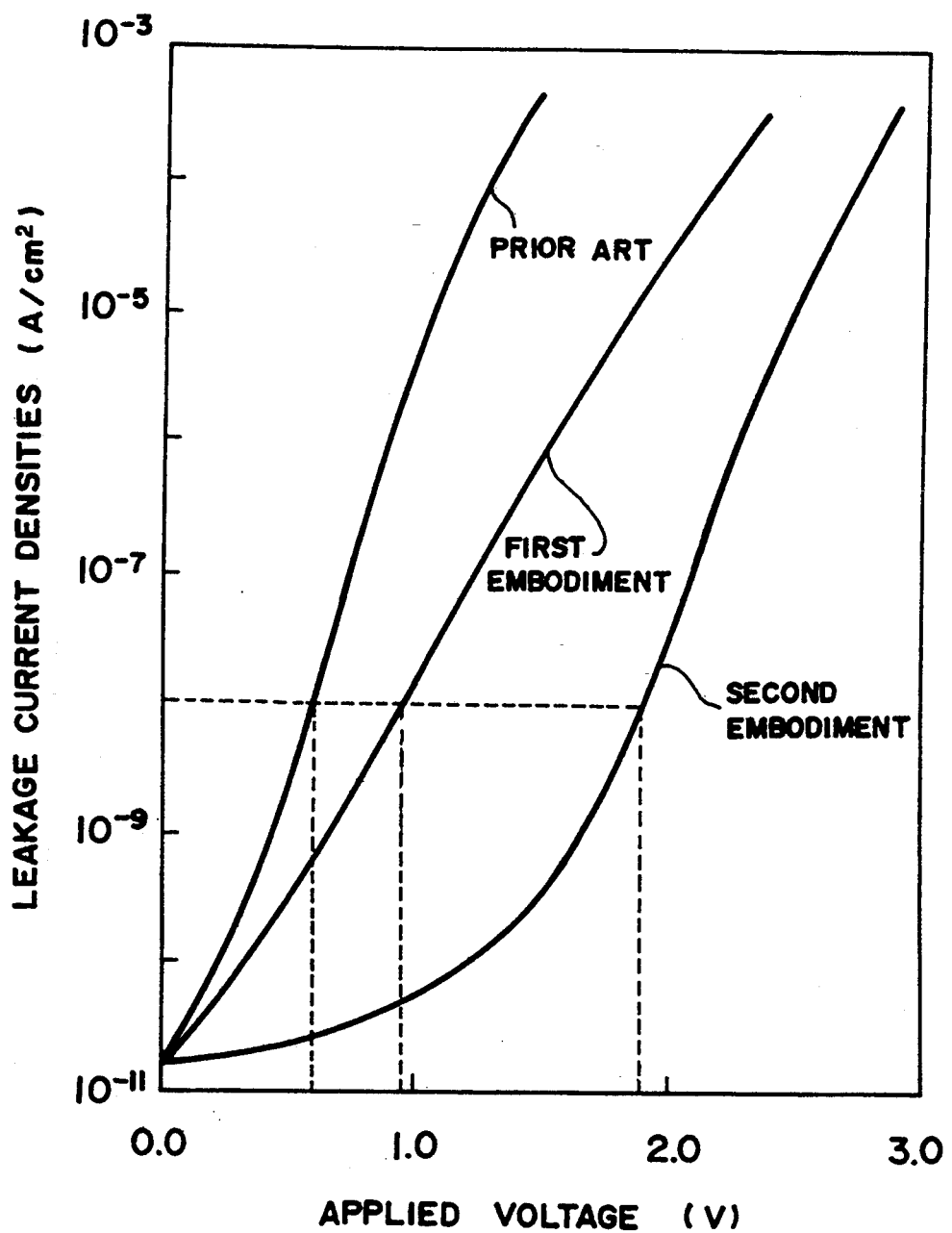
FIG. 6 is a graph showing leakage current characteristics in the structures fabricated according to the methods of the prior art, the first embodiment and the second embodiment of the invention.

FIG. 6 shows leakage current characteristics of the tantalum oxide films in devices manufactured on the basis of the first and second embodiments of the invention. The graph shows the leakage current characteristics of tantalum oxide films formed on the basis of the first and second embodiments and the prior art. The leakage current characteristic of the tantalum oxide film formed on the basis of the first embodiment is superior to that on the basis of the prior art. This is so because the titanium impurity doped during the tantalum oxide film formation has an effect of burying dangling bonds in the tantalum oxide film, thus reducing electric trap sites. The leakage current characteristic of the tantalum oxide film obtained on the basis of the second embodiment is superior to that obtained on the basis of the first embodiment. This is so because the densifying treatment by the high temperature heat treatment carried out after the titanium-doped tantalum oxide film formation has an effect of externally diffusing carbon or water content in the tantalum oxide film. The leakage current characteristics of the tantalum oxide films formed on the basis of the first and second embodiments of the invention are satisfactory to practical devices.

As has been described in the foregoing, according to the present invention, the capacitor used for super-LSIs such as DRAMs is formed by a process comprising the steps of (1) removing the natural oxide film on the surface of the lower or inner electrode of polysilicon, (2) forming the impurity-doped tantalum oxide film, and (3) forming an upper electrode with at least the bottom thereof constituted by titanium nitride, thus permitting the thickness reduction of the capacitive insulating film and the formation of a satisfactory capacitor device with improved leakage current characteristics.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating a semiconductor device comprising the steps of:
   removing a natural oxide film on a surface of a lower electrode of polysilicon;
   forming on the surface of said lower electrode a tantalum oxide film doped with impurities; and
   forming on said tantalum oxide film an upper electrode with at least a bottom of said upper electrode constituted by titanium nitride.

2. The method of fabricating a semiconductor device according to claim 1, wherein said step of removing the natural oxide film is a treatment using anhydrous hydrofluoric acid.

3. The method of fabricating a semiconductor device according to claim 1, wherein said impurity is at least a member of the group consisting of titanium (Ti), silicon (Si), boron (B), phosphorus (P) and germanium (Ge).

4. The method of fabricating a semiconductor device according to claim 1, wherein said step of forming said tantalum oxide film is performed by chemical vapor deposition using an organic tantalum material.

5. The method of fabricating a semiconductor device according to claim 1, wherein said step of forming the tantalum oxide film is performed by impurity doping through a chemical vapor phase reaction using an organic material.

6. The method of fabricating a semiconductor device according to claim 1, in which said process of forming the capacitor element further comprises the steps of:
   nitriding the surface of said lower electrode of polysilicon after said step of removing said natural oxide film; and
   densifying said tantalum oxide film through a high temperature heat treatment after the formation of said tantalum oxide film.

7. The method of fabricating a semiconductor device according to claim 6, wherein said step of nitriding the surface of said lower electrode of polysilicon is performed by a quick temperature raise heat treatment using ammonia gas ($NH_3$).

8. The method of fabricating a semiconductor device according to claim 6, wherein said high temperature heat treatment is carried out by a quick temperature raise heating system using an electric furnace or a lamp heating.

9. The method of fabricating a semiconductor device according to claim 6, wherein said high temperature heat treatment is carried out in an inert gas atmosphere.

* * * * *